United States Patent [19]
Taub et al.

[11] Patent Number: 5,822,246
[45] Date of Patent: Oct. 13, 1998

[54] METHOD AND APPARATUS FOR DETECTING THE VOLTAGE ON THE VCC PIN

[75] Inventors: Mase J. Taub, Elk Grove; Jahanshir J. Javanifard, Sacramento, both of Calif.

[73] Assignee: Intel Corporation, Santa Clara, Calif.

[21] Appl. No.: 723,270

[22] Filed: Sep. 30, 1996

[51] Int. Cl.⁶ ............................... G11C 11/34; G11C 7/00
[52] U.S. Cl. ............................... 365/185.18; 365/185.21; 365/185.33; 365/226; 365/229
[58] Field of Search .................. 365/185.18, 185.21, 365/185.33, 189.07, 189.09, 226, 229

[56] References Cited

U.S. PATENT DOCUMENTS

| | | | |
|---|---|---|---|
| 5,371,705 | 12/1994 | Nakayama et al. | 365/189.09 |
| 5,444,664 | 8/1995 | Kuroda et al. | 365/226 |
| 5,495,453 | 2/1996 | Wociechowski et al. | 365/226 |
| 5,559,717 | 9/1996 | Tedrow et al. | 365/189.07 |
| 5,610,869 | 3/1997 | Yoo et al. | 365/226 |
| 5,627,493 | 5/1997 | Takeuchi et al. | 365/226 |

OTHER PUBLICATIONS

U.S. Patent Application of Tedrow, et al., entitled "High Precision Voltage Detector Utilizing Flash EEPROM Memory Cells", Application No.: 08/217,165, filed Mar. 23, 1994.

*Primary Examiner*—David C. Nelms
*Assistant Examiner*—Trong Phan
*Attorney, Agent, or Firm*—Blakely, Sokoloff, Taylor & Zafman LLP

[57] ABSTRACT

A method and apparatus for detecting the power supply voltage level of a circuit. A control circuit is used to enable or disable a first voltage level detector circuit and a second voltage level detector circuit. The first voltage level detector circuit consumes less power than the second voltage level detector circuit. The first voltage level detector circuit is enabled during all user modes of operation. The second voltage level detector circuit is enabled during the normal or active mode of operation and during power-up in all user modes of operation. The second voltage level detector circuit may also be enabled during a reduced power mode of operation that does not consume the least amount of power. A select circuit selects the output from either the first voltage level detector or the second voltage level detector. The first voltage level detector circuit is selected during the user mode that consumes the least amount of power. The second voltage level detector circuit is selected during the active or normal mode of operation and during power-up in all user modes of operation. The second voltage level detector circuit may also be selected during a reduced power mode of operation that does not consume the least amount of power.

25 Claims, 14 Drawing Sheets

Fig. 1b (PRIOR ART)

| SIGNALS / LINE # | DEEP POWER DOWN | PULSE GENERATOR | TEST MODE | DETECTOR PROGRAMMING ENABLE | DETECTOR ENABLE | NOTES |
|---|---|---|---|---|---|---|
| 1 | 0 | x | 1 | 1 | 0 | TEST MODE |
| 2 | 0 | x | 0 | 0 | 1 | STANDBY/ ACTIVE MODE |
| 3 | 1 | 0 | 0 | 0 | 0 | DEEP POWER DOWN |
| 4 | 1 | 1 | 0 | 0 | 1 | DEEP POWER DOWN |

1 - SIGNAL ASSERTED
0 - SIGNAL DEASSERTED
x - DON'T CARE

| SIGNALS / LINE #s | PDRM-3VC | PD-EN | HD35-PUP | HDLF-OSCP | PD3-VCC | PD3V-CSUB | PDSU-BDEN | PD35-EN | PD35-MUX | PD35-EQ | PD5VCC | NOTES |
|---|---|---|---|---|---|---|---|---|---|---|---|---|
| 1 | 1 | X | X | X | 1 | 1 | 1 | 1 | 1 | 0 | 0 | Power up mode. Ramp detector delay asserted, force active detector on for fast ramp rate. |
| 2 | 1 | X | X | X | 0 | X | 1 | 1 | 1 | 1 | 1 | Power up mode. Ramp detector delay asserted, force active detector on for fast ramp rate. Force ULC into tripped state. |
| 3 | 0 | 0 | 0 | 0 | X | X | 1 | 0 | 0 | 0 | 0 IF VCC = 3.3V / 1 IF VCC = 5.0V | Deep powerdown mode. |
| 4 | 0 | 0 | 0 | 1 | 1 | 0 | 1 | 1 | 0 | 0 | 1 | Deep powerdown, HDLFOSC pulse. Wait for active 3.3/5 detector to warm-up. |
| 5 | 0 | 0 | 0 | 1 | 0 | 0 | 1 | 1 | 1 | 0 | 1 | Deep powerdown, HDLFOSCpulse. |
| 6 | 0 | 0 | 0 | 1 | X | 1 | 1 | 1 | 1 | 0 | 0 | Deep powerdown, HDLFOSC pulse, Vcc<4.0V. |
| 7 | 0 | 1 | 0 | X | X | X | 1 | 1 | 1 | 0 | 0 IF VCC = 3.3V / 1 IF VCC = 5.0V | Standby/Active mode. |
| 8 | 0 | 1 | 1 | X | X | X | 1 | 1 | 0 | 0 | 0 IF VCC = 3.3V / 1 IF VCC = 5.0V | Standby/Active, warm-up from deep powerdown. |
| 9 | 0 | 1 | X | X | X | X | 0 | 0 | 1 | 0 | 1 | Detector trim mode. |

1 - SIGNAL ASSERTED; 0 - SIGNAL DEASSERTED; X - DON'T CARE

Fig. 6

METHOD AND APPARATUS FOR DETECTING THE VOLTAGE ON THE VCC PIN

FIELD OF THE INVENTION

The present invention relates generally to power management of integrated circuits and more particularly to the power management of nonvolatile memory devices.

BACKGROUND OF THE INVENTION

Flash memories are well known for their non-volatility, high-density, in-circuit write and erase capability, random access, high reliability and low power consumption. These characteristics of flash memories make them suitable for many types of applications, often replacing many of the more traditional storage devices (i.e., erasable programmable read only memories ("EPROMS"), dynamic random access memories ("DRAMs"), static random access memories ("SRAMs"), electrically erasable programmable memories ("EEPROMs"), and disk drives). For example, in a computer system, the flash memories may replace the EPROMs devices that handle code and basic input output system ("BIOS") storage, or may replace the disk drive.

Recently, flash memories which are capable of operating at various Vcc voltage levels (i.e., 3.3 volts and 5.0 volts) have gained wide acceptance in the marketplace. The ability of the flash memories to operate at more than one voltage level increases their compatibility with low powered systems. For example, many portable systems, such as portable computer systems or portable consumer products, may use 3.3 volt components or a combination of 3.3 volts and 5.0 volts components to reduce the power consumption and to extend the battery life of a portable computer. On the other hand, other systems may use all 5.0 volt components. Therefore, the ability to configure flash memories to operate at both 3.3 volts and 5.0 volts makes the flash memories an attractive solution for systems requiring 3.3 volts, 5.0 volts, or a combination of 3.3 volts and 5.0 volts components.

Flash memories that are compatible with various power supply voltage levels usually include circuitry for detecting the voltage level of the power supply. Typically, each flash memory device configures itself for operation in response to the detected voltage level. The circuitry used to detect the power supply voltages is coupled to the power supply source.

Assuming a flash memory device is designed to operate at both 3.3 volts and 5.0 volts, then a 3.3V/5.0V level voltage detector circuit determines whether the power supply is providing 5.0 volts or 3.3 volts to the flash memory device. Although, the flash memory device may be configured to operate at either 3.3 volts or 5.0 volts, various circuits within the flash memory device may require 5.0 volts to operate. Therefore, if 3.3 volts is detected by the 3.3V/5.0V detector, then the flash memory device charges up the 3.3 volts to 5.0 volts before sending the power supply voltage signal to other devices within the flash memory device. For example, if a flash memory cell requires 5.0 volts to be applied to its gate to be read and a 3.3 volts is detected by the flash memory device, the internal power supply is charged up by a charge pump to 5.0 volts.

Currently available flash EEPROM devices are capable of operating in various power savings modes. In addition to operating in the active mode, some flash EEPROM devices are capable of operating in a standby mode and a deep power down mode. While operating in the active mode, the flash EEPROM devices may draw sufficient power from the VCC power supply to perform read, program, and erase operations. While operating in the standby mode, the flash EEPROM devices are prevented from performing any operations on the memory cell array while being placed in a ready to read mode. The amount of power that the flash EEPROM device may consume while operating in the standby mode is reduced. The power consumption of the flash EEPROM device is reduced even further while operating in the deep power down mode. During the deep power down mode significant power savings is achieved by disabling all memory cell array operations.

FIG. 1a illustrates a typical power supply voltage level detector 100. According to FIG. 1a, the power supply voltage level detector 100 includes a detector circuit 110 coupled to a control circuit 120.

The detector circuit 110 includes at least one flash EEPROM cell which requires programming. Typically, the flash EEPROM cells in the detector circuit 110 are programmed during the testing of the flash EEPROM device. To indicate that the flash EEPROM device is operating in the test mode, the control circuit 120 receives an asserted test mode signal 130b. In response to an asserted test mode signal 130b, the control logic 120 generates an asserted programming enable signal 140b. The programming enable signal 140b allows the flash EEPROM cells in the detector circuit 110 to be programmed.

When the flash EEPROM device is operating in either the active or standby modes of operation, the deep power down signal 130a and the test mode signal 130b are deasserted. During the active and standby modes of operation, the control circuit 120 generates an asserted detector enable signal 140a to enable the detector circuit 110 to detect the power supply voltage level.

When the flash EEPROM device is operating in the deep power down mode of operation, the control circuit 120 receives an asserted deep power down signal 130a. The pulse generator signal 130c determines whether the control circuit 120 generates an asserted or deasserted detector enable signal 140a. In response to an asserted pulse generator signal 130c, the control circuit 120 generates an asserted detector enable signal 140a and in response to a deasserted pulse generator signal 130c, the control circuit 120 generates a deasserted detector enable signal 140a. Typically, the pulse generator signal 130 is periodically asserted for a first duration and deasserted for a second duration. The second duration is usually much longer than the first duration. Therefore, although the detector circuit 110 is considered disabled during the deep power down mode of operation, it is periodically enabled to detect the power supply voltage level. Note that during the test, the active, and the standby modes, it is irrelevant whether the pulse generator signal 130c is asserted or deasserted.

FIG. 1b illustrates a truth table for the various input signals 130a, 130b, and 130c received by the control circuit 120 and the output signals 140a and 140b generated by the control circuit 120. Line 1 illustrates the states of the signals during the test mode. Line 2 illustrates the states of the signals during the standby or the active modes of operation. Lines 3 and 4 illustrate the states of the signals during the deep power down mode.

One of the drawbacks of the prior art detector circuit 100 is that during the deep power down mode of operation of the flash EEPROM device, the detector circuit 100 is periodically turned on and off. By disabling the flash EEPROM device during deep power down in this manner, the detector circuit 100 continues to consume power, although less power than during the standby mode. Additionally, the flash EEPROM device is considered less reliable because the detector circuit 100 does not provide continuous feedback to the charge pumps. Without continuous feedback from the detector circuit 100 during the power down mode, the detector may not detect a change in the voltage level of VCC and under certain circumstances, the failure to detect such a change may damage the flash EEPROM device. For example, if voltage level of VCC increases from 3.3 volts to 5 volts while the detector circuit is disabled, the charge pumps will continue to pump up the voltage level of VCC, despite the fact that the voltage level of VCC no longer needs to be charged. The voltage level of VCC may be raised to a level which damages the flash EEPROM device.

SUMMARY OF THE INVENTION

One object of the present invention is to provide a power supply voltage level detector circuit that minimizes the power consumption.

Another desire of the present invention is to provide a power supply voltage level detector circuit that is capable of detecting changes in the power supply voltage level continuously during all user modes, including the reduced power mode.

An apparatus for detecting the power supply voltage level is described. The apparatus includes a control circuit, a first and a second voltage level detector circuit, and a select circuit. The control circuit provides a first enable signal, a second enable signal, and a control signal. The first voltage level detector circuit is coupled to the control circuit and provides a first output signal in response to an asserted first enable signal. The second voltage level detector circuit is coupled to the control circuit and provides a second output signal in response to an asserted second enable signal. The select circuit is coupled to the control circuit. The select circuit selects one of the first output signal and the second output signal in response to the control signal.

A method for detecting the power supply voltage level of a circuit is also described. The method includes the step of providing a power supply voltage to the circuit. The first and the second voltage level detector circuits are enabled. The second voltage level detector circuit is selected. The mode of operation of the circuit is determined. If the circuit is operating in the reduced power mode, the second voltage level detector circuit is disabled. The second voltage level detector circuit is deselected and the first voltage level detector circuit is selected. The selected one of the first voltage level detector circuit and the second voltage level detector circuit outputs a voltage level detection signal.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which:

FIG. 1b illustrates a truth table for the VCC voltage level detector circuit in FIG. 1.

FIG. 6 illustrates a truth table for the present VCC voltage level detector circuit in FIG. 5.

DETAILED DESCRIPTION

Figure 1A:
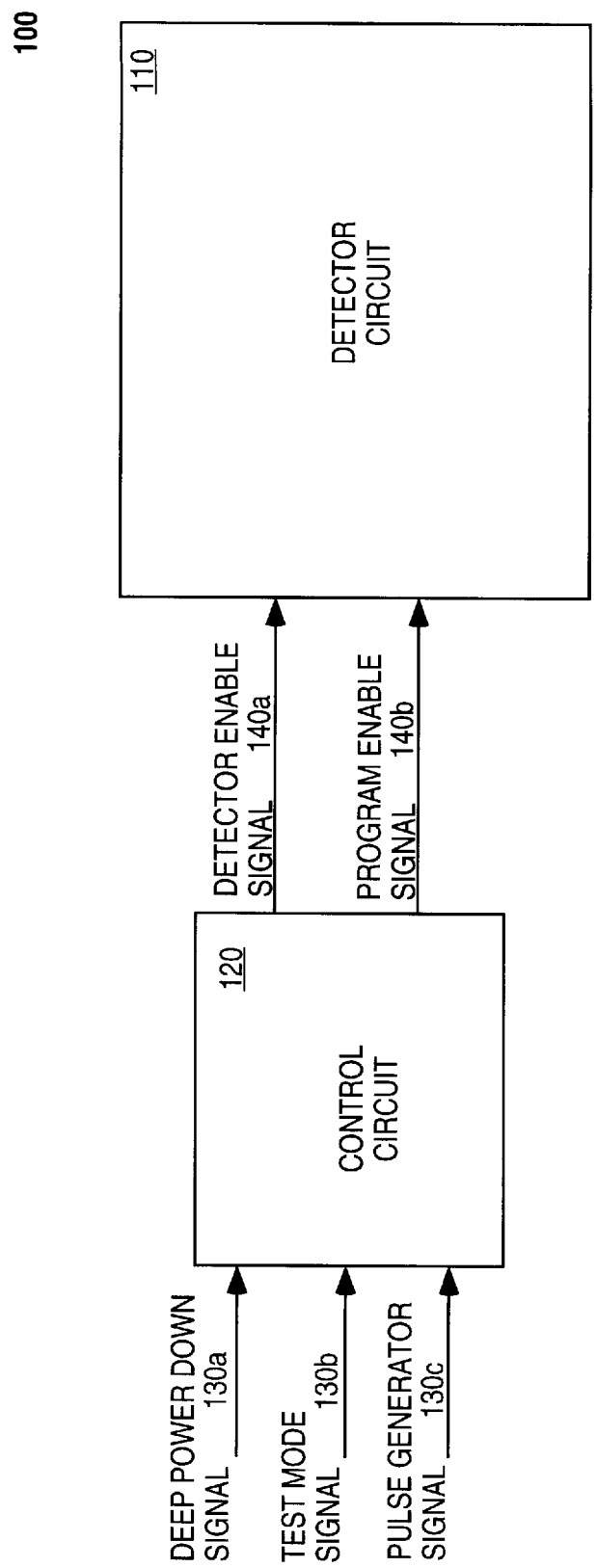
FIG. 1a illustrates a typical VCC voltage level detector circuit.
Figure 2:
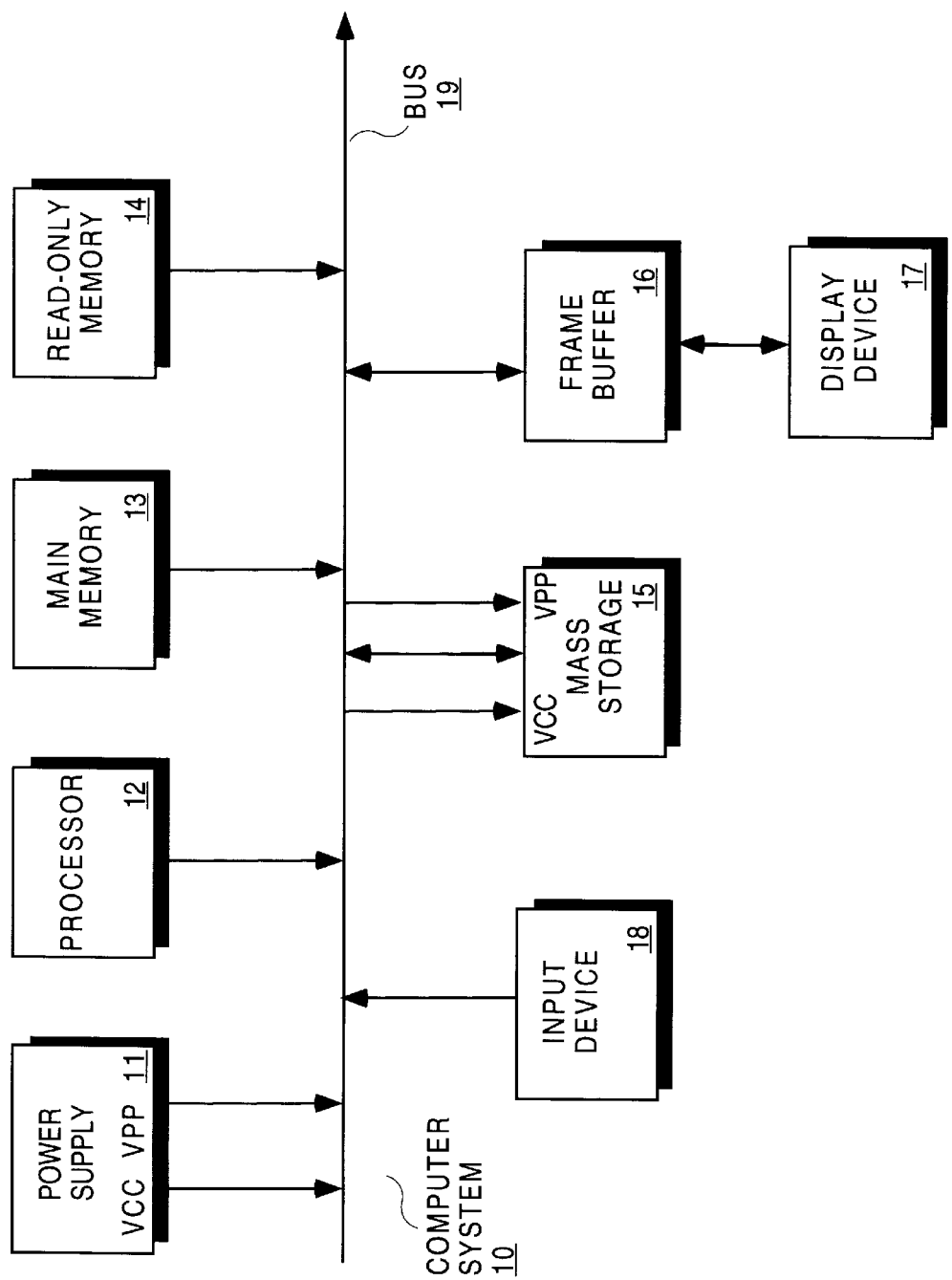
FIG. 2 illustrates a computer system that includes the present voltage level detector circuit.

FIG. 2 shows a general purpose computer system 10. The computer system 10 may be a portable computer, a workstation, a minicomputer, a mainframe, or any other type of computer. The computer system 10 includes a power supply 11, a central processing unit ("CPU") 12, a main memory 13, a read only memory 14, a mass storage device 15, a frame buffer 16, and an input device 18, all of which are coupled to a bus 19. The bus 19 includes a data bus and acts as a primary interconnect for the components of the computer system 10 so that data may be transferred among the various components. The computer system 10 also includes a display device 17 that is coupled to the frame buffer 16 for receiving image data for display. The read only memory 14 may be a flash EEPROM device, and the mass storage device may be a "solid state disk drive" that includes a plurality of flash EEPROM devices for emulating the operation of a magnetic hard disk drive.

The power supply 11 therefore includes a VCC supply output for supplying the operating voltage VCC of the computer system 10 to the components of the computer system via power conductors of the bus 19. If the computer system 10 is a portable computer, the power supply 11 may be a rechargeable battery. The power supply 11 may also include a VPP supply output for supplying the programming voltage VPP to the read only memory 14 or the mass storage device 15. If the power supply 11 does not include a separate VPP supply output, the VPP input of the flash EEPROMs included in the computer system 10 may be coupled to receive the VCC operating voltage.

Figure 3:
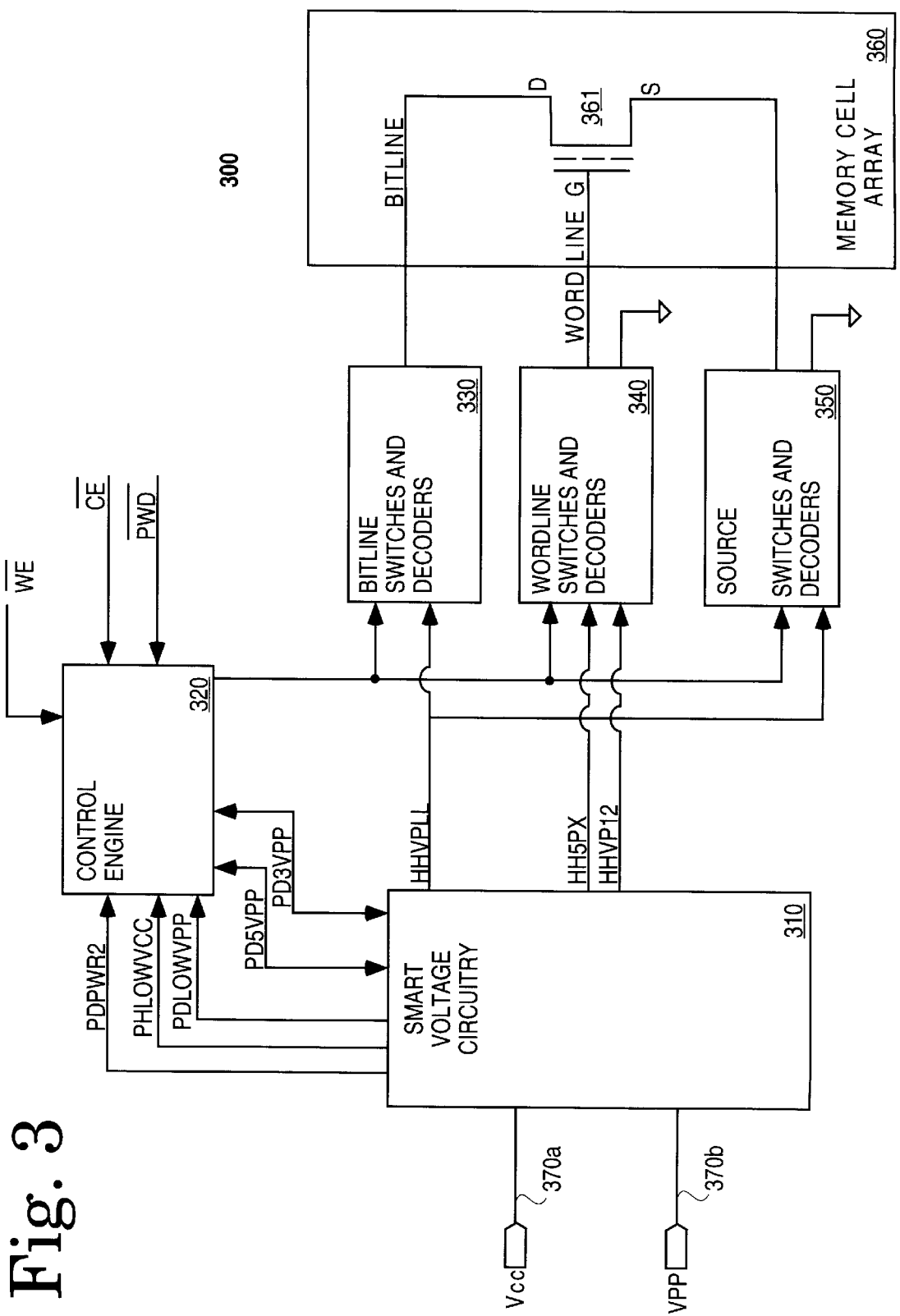
FIG. 3 illustrates one embodiment of a flash EEPROM device that incorporates the present VCC voltage level detector circuit.

FIG. 3 illustrates one embodiment of a flash EEPROM device 300 that includes circuitry for detecting the system supply voltages. The flash EEPROM device 300 is an integrated circuit that may be formed on a single semiconductor substrate and typically includes a memory cell array 360 which includes a plurality of flash memory cells 361. The flash memory cells 361 are typically floating gate transistor devices having a select gate terminal, a floating gate, a drain terminal and a source terminal. Furthermore, the flash memory cells 361 are typically arranged in a matrix of rows and columns such that a common wordline is coupled to the select gate terminal of each flash memory cell of a row, and a common bitline is coupled to the drain of each flash memory cell of a column.

The flash memory cell 361 is programmed by placing excess charge on the floating gate, which increases the threshold voltage Vt of the flash memory cell 361. For one embodiment, programming may be accomplished by applying 12.0 volts to the gate terminal, 6.0 volts to the drain terminal, and grounding the source terminal such that electrons are placed on the floating gate by hot electron injection.

The flash memory cell 361 is erased by removing the excess charge from the floating gate. For one embodiment, erasing may be accomplished by applying 5.0 volts to the source terminal, applying −9.0 volts to the gate terminal, and allowing the drain terminal to float such that electrons are removed from the floating gate via electron tunneling. It is possible to erase several flash memory cells simultaneously by performing a block erase.

To determine whether the flash memory cell 361 is in the erased state or the programmed state, a constant voltage is applied to the select gate terminal of the flash memory cell to sense the amount of drain-source current $I_{DS}$ for the flash memory cell 361. If the flash memory cell 361 is programmed, for one embodiment, a read operation may be performed by applying 5.0 volts to the gate terminal, grounding the source terminal, and applying 1.0 volt to the drain terminal.

To perform read, program, and erase operations on a selected set of flash memory cells, the flash EEPROM device 300 includes bitline switches and decoders 330, wordline switches and decoders 340, and source switches and decoders 350, all of which are controlled by the control engine 320. The control engine 320 enables the selection of the desired flash memory cells and applies the appropriate voltages to the selected flash memory cells.

For one embodiment, the flash EEPROM device 300 has three modes of operation—an active mode, a standby mode, and a deep power down mode. The standby and the deep power down modes are reduced power modes. To define the mode of operation, the flash EEPROM device 300 receives the controls signals chip enable $\overline{CE}$, write enable $\overline{WE}$, and power down $\overline{PWD}$. In the active mode of operation, the control signal $\overline{CE}$ is asserted and the control signal $\overline{PWD}$ is deasserted. In the standby mode of operation, the controls signals $\overline{CE}$, and $\overline{PWD}$ are deasserted. In the deep power down mode of operation, the control signal $\overline{PWD}$ is asserted.

The smart voltage circuitry 310 is coupled to the VCC input pin 370a and the VPP input pin 370b of the flash EEPROM device 300. The smart voltage circuitry 310 provides the required voltages to the bitline switches and decoders 330, the wordline switches and decoders 340, and the source switches and decoders 350 via signals HHVPLL, HH5PX, and HHVP12 as shown in FIG. 3.

Figure 4:
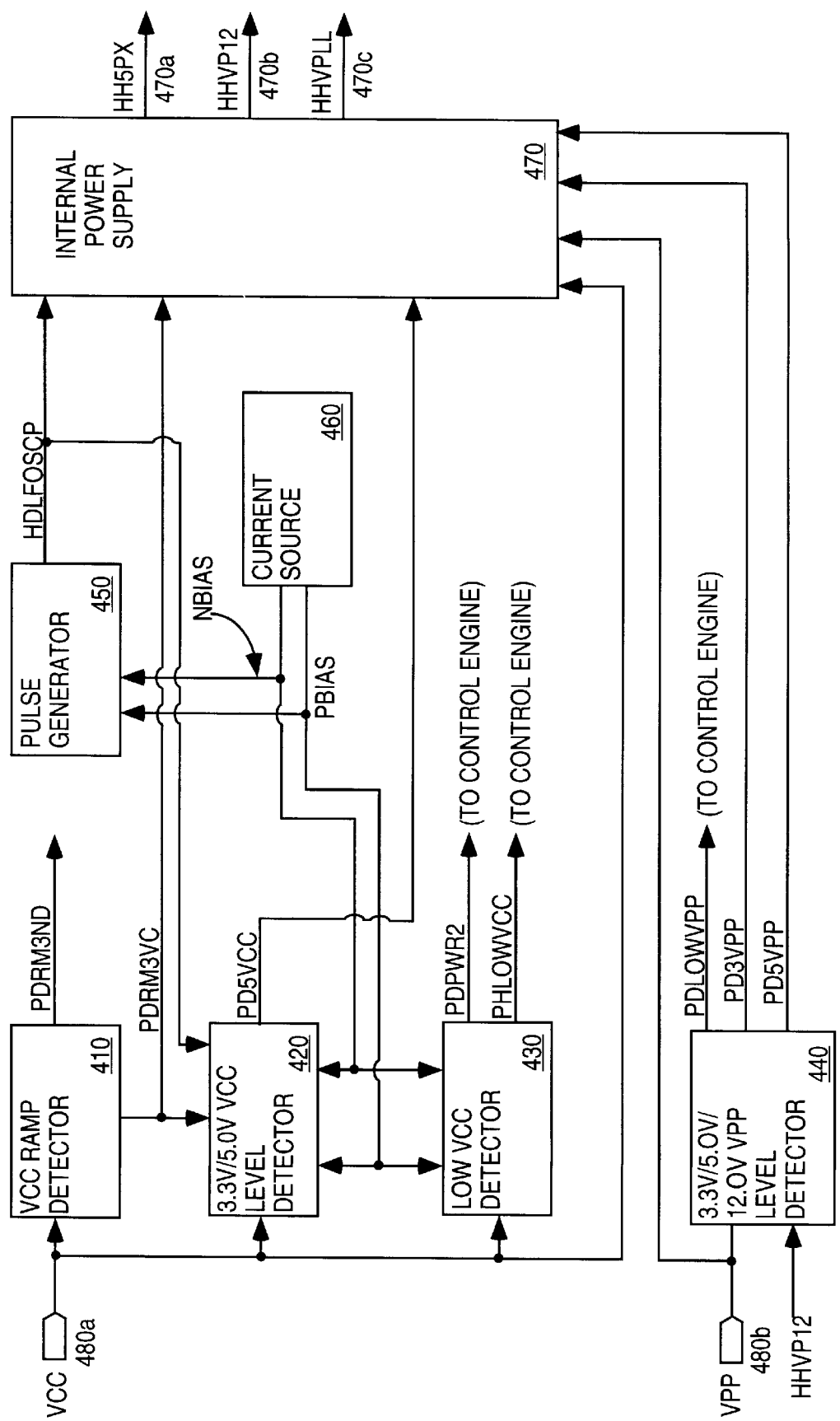
FIG. 4 illustrates one embodiment of a smart voltage circuit that incorporates the present VCC voltage level detector circuit.

FIG. 4 illustrates one embodiment of the smart voltage circuitry 400. The smart voltage circuitry 400 includes a VCC ramp detector 410, a 3.3V/5.0V VCC level detector 420, a low VCC detector 430, a current source 460, a pulse generator 450, 3.3V/5.0V/12.0V VPP level detector 440, and an internal power supply 470. The operation of the internal power supply 470 is determined by the mode of operation of the flash EEPROM device 300, the external operation supply voltage VCC, and the external programming supply voltage VPP.

The VCC ramp detector 410 is provided to enable the internal power supply 470 and to initialize the 3.3V/5.0V VCC level detector 420 when power is first applied to the flash EEPROM device 300. The VCC ramp detector 410 provides a direct output signal referred to as the PDRM3ND signal. The VCC ramp detector 410 also provides a delayed version of the PDRM3ND signal referred to as the PDRM3VC signal.

The 3.3V/5.0V VCC level detector 420 is provided to detect whether the power supply is providing 3.3 volts or 5.0 volts. The 3.3V/5.0V VCC level detector 420 generates the signal PD5VCC which indicates the power supply voltage level. For an alternative embodiment, the VCC level detector may be used to detect operating voltages other than 3.3 volts and 5.0 volts.

The program and erase operations are inhibited if a low external supply voltage VCC level is detected by the low VCC detector 430 while the flash EEPROM device 300 is in the active mode of operation. In other words, if VCC is above a certain threshold voltage, then the control engine 320 is enabled and if VCC is below the threshold voltage, the control engine is not enabled. The low VCC detector 430 provides the output signals PDPWR2 and PHLOWVCC to the control engine 320. The PDPWR2 signal resets the control engine 320 and prevents writing to the flash EEPROM device 300 during the low VCC conditioning when asserted. The PHLOWVCC signal is used to prevent the VPP programming voltage from propagating through the part and possibly disturbing the data in the flash EEPROM device 300 during the low VCC conditions. Basically, the low VCC detector 430 prevents the flash EEPROM 300 from performing spurious write commands.

The current source 460 and the pulse generator 450 are included to conditionally and periodically enable the internal power supply 470 for charging the wordline switches (via the HH5PX signal) to 5.0 volts while the flash EEPROM device 300 operates in either the standby or deep power down operating modes. The pulse generator 450 provides the output signal HDLFOSCP to the internal power supply 470 and the 3.3V/5.0V VCC level detector 420. The NBIAS and PBIAS signals generated by the current source 460 are used to bias the pulse generator 450 and also used to bias the circuitry in the 3.3V/5.0V VCC level detector 420 and the low VCC detector 430.

The internal power supply 470 provides three output lines 470a, 470b, and 470c. The HH5PX output line 470a may be coupled to the wordline switches 340 for read operations. The HHVPLL output line 470c may be coupled to the bitline switches 330 for programming operations and to the source switches for erase operations. The HHPV12 output line 470b may be coupled to the wordline switches 340 for programming operations.

The 3.3V/5.0V/12V VPP level detector 440 detects the voltage level of the programming supply voltage VPP. The PDLOWVPP signal is asserted when the voltage level of the HHPV12 signal is below the programming voltage level. The PD3VPP signal is asserted when VPP is detected to be in the 3.3 volt range. The PD5VPP signal is asserted when VPP is detected to be in the 5.0 volt range. Both PD5VPP and PD3VPP are deasserted when VPP is detected to be in the 12.0 volt range.

Figure 5:
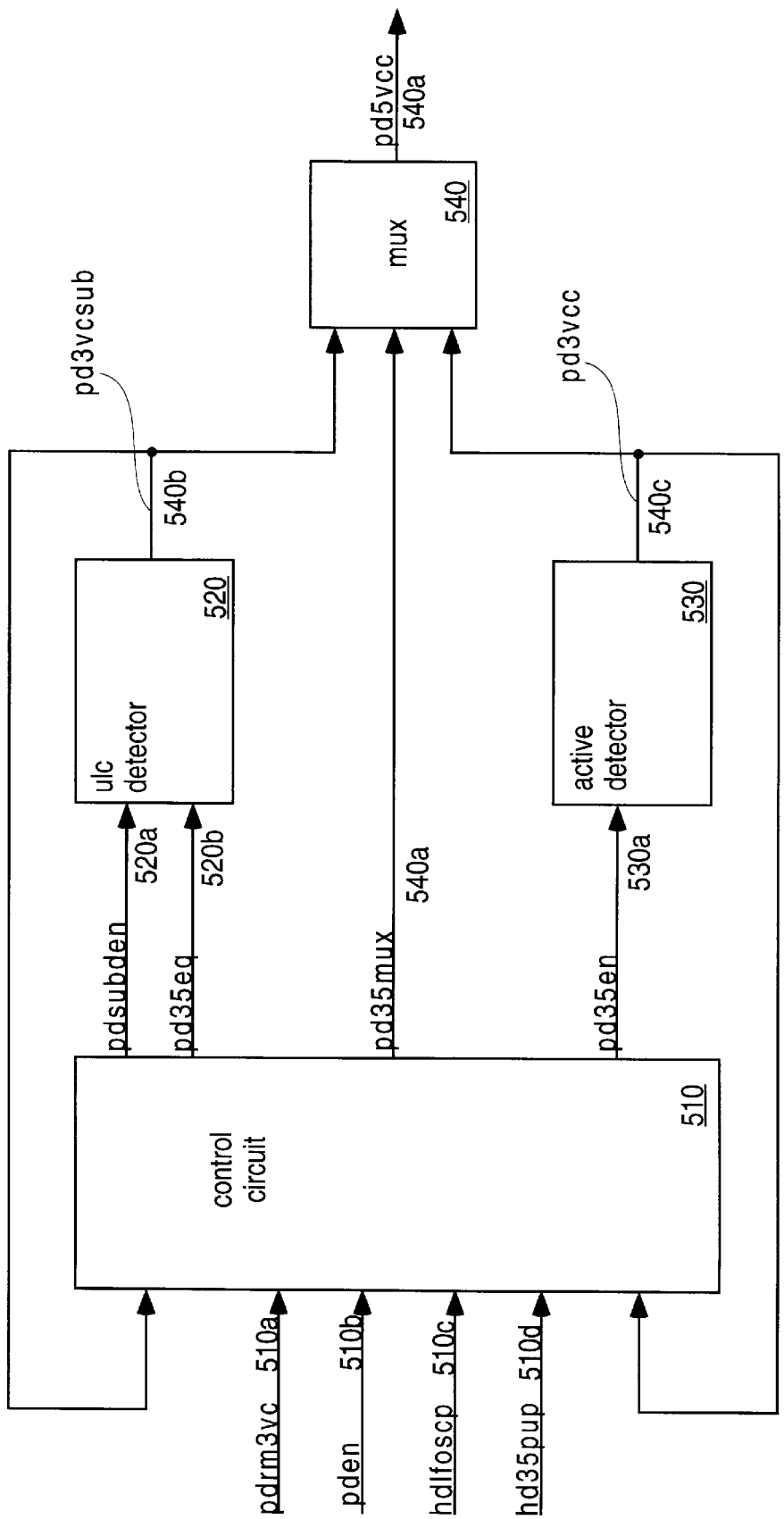
FIG. 5 illustrates one embodiment of the present VCC voltage level detector circuit.

FIG. 5 illustrates one embodiment of the 3.3V/5.0V VCC level detector 500. The 3.3V/5.0V VCC level detector 500 includes an active detector 530, an ultra low detector ("ULC") 520, a control circuit 510 and a multiplexer circuit 540. The 3.3V/5.0V VCC level detector detects the voltage on the VCC pad or pin of the flash EEPROM device. For an alternative embodiment, the 3.3V/5.0V VCC level detector may include only the ULC detector 520 and a control circuit. For this alternative embodiment, the control circuit does not include circuitry to select between the ULC and the active detectors. Similar to the embodiment that uses both the ULC detector 520 and the active detector 530, the alternative embodiment using only the ULC detector is also capable of detecting changes in the power supply voltage level continuously during all user modes, including the reduced power mode.

For illustrative purposes, the VCC voltage level detector circuit is described as part of a flash memory device that is capable of operating with either a 3.3 volt or a 5.0 volt power supply. For an alternative embodiment, the present power supply voltage level detector circuit may be used to detect the voltage on the VCC pin of any circuit or device that is capable of operating at various VCC voltage levels. In other words, the present embodiment is not limited to voltage level detector circuits that are incorporated into flash memory devices. Furthermore, the present embodiment is not limited to detecting only 3.3 volts and 5.0 volts and may be used to detect other voltages as well.

The control circuit 510 receives a plurality of input signals used primarily for enabling and disabling the active and the ULC detectors and for selecting one of the detectors to provide the output signal PD5VCC over line 540*a*. The control circuit 510 receives the PDRM3VC signal over line 510*a*, the PDEN signal over line 510*b*, the HDLFOSCP signal over line 510*c*, and the HD35PUP signal over line 510*d*.

The PDEN signal, referred to as the power-up circuit enable signal, indicates whether the 3.3V/5.0V VCC level detector is selected to operate in the power-down, the standby, or the active mode. When the power-down mode is selected, the PDEN signal is deasserted and when either the standby or active mode is selected, the PDEN signal is asserted.

The PDRM3VC signal provides a delay signal during the power-up mode when VCC is ramping up to either 3.3 volts or 5.0 volts. The VCC ramp detector 410 generates the PDRM3VC signal while detecting a VCC ramp during power-up. Despite the fact that the active detector is generally disabled during the deep power down mode, the active detector is enabled during power-up in all user modes including the deep power down mode.

The HDLFOSCP signal refers to the low frequency oscillator pulse signal generated by the pulse generator 450. The HDLFOSCP signal periodically provides a pulse to enable the active detector in the deep power down mode. Note that the HDLFOSCP signal is also used to periodically enable the charge pumps in the internal power supply 470 during the deep power down mode. For one embodiment, the pulse width is within the range of 5–10 microseconds and the period is approximately 3 milliseconds.

The PD35PUP signal provides a delay signal sufficient to allow the active detector to warm-up when transitioning from the deep power down mode to either the standby or active modes.

The control logic 510 generates two enable signals—the PDSUBDEN signal which enables the ULC detector 520, and the PD35EN signal which enables the active detector 530. Typically, the ULC detector 520 is enabled during all user modes, and the active detector 530 is enabled during the standby and active modes and during power-up in all user modes. The active detector 530 is generally considered disabled during the deep power down mode.

The PDSUBDEN signal is referred to as the ULC detector 520 enable signal and is used to enable the ULC detector 520 during all user modes of the flash EEPROM device. In other words, the ULC detector 520 is enabled during the power-down, the standby, the active, and the power-up modes. On the other hand, during testing when the EEPROM cells in the ULC detector 520 are programmed or trimmed to achieve the desired trip point, the PDSUBDEN signal is deasserted. The active detector 530 is enabled by an asserted PD35EN signal. The PD35EN signal is asserted during the standby, the active, and the power-up modes and deasserted during the detector program mode and the deep power down mode.

The control logic 510 also generates the PD35MUX signal and the PD35EQ signal. The PD35MUX signal is used as the select signal for the multiplexer 540. The PD35MUX signal selects either the PD3VCSUB signal outputted by the ULC detector 520 or the PD3VCC signal outputted by the active detector 530 as the input into the multiplexer 540. The PD35EQ signal is used to force the ULC detector 520 into the tripped state when asserted. The assertion of the PD35EQ signal will be described in more detail below.

The ULC detector 520 receives the PDSUBDEN signal over line 520*a* and the PD35EQ signal over line 520*b*. The PD3VCSUB signal is generated by the ULC detector 520 and indicates the VCC voltage level. For one embodiment, an asserted PD3VCSUB signal indicates that VCC is at 3.3 volts and a deasserted PD3VCSUB signal indicates that VCC is at 5.0 volts. The active detector 530 receives the PD35EN signal over line 530*a* and generates an output signal PD3VCC to indicate the VCC voltage level. Similar to the PD3VCSUB signal generated by the ULC detector 520, an asserted PD3VCC signal indicates that VCC is at 3.3 volts and a deasserted PDVCC signal indicates that VCC is at 5.0 volts.

The multiplexer 540 selects PD3VCSUB or PD3VCC in response to the PD35MUX signal received over line 540*a*. For one embodiment, when PD35MUX signal is asserted, the PD3VCC signal is selected; and when PD35MUX signal is deasserted, the PD3VCSUB signal is selected. Therefore, the value of either the PD3VCSUB signal or the PD3VCC signal is outputted over line 540*a* as the PD5VCC signal. The PD3VCC and the PD3VCSUB signals are fed back into the control circuit 510 to decode the various states of the detectors during the deep power down and power-up modes.

The 3.3V/5.0V VCC level detector 500 may be used in many different types of integrated circuits and more particularly, memory devices. For example, the 3.3V/5.0V VCC level detector 500 described herein may be used in a circuit that is capable of being manufactured using a floating gate technology such as EPROM or EEPROM. Furthermore, the VCC level detector may be used to detect various operating voltage levels other than 3.3 volts and 5.0 volts.

FIG. 6 illustrates a truth table for the various modes of operation of the 3.3V/5.0V VCC level detector 500. The various input signals received by the control logic 510, the control signals generated by the control logic 510, and the output signal of the 3.3V/5.0V VCC level detector 500 are indicated across the top of the truth table. Lines 1 and 2 are used to illustrate the conditions required to power-up the 3.3V/5.0V VCC level detector 500. Lines 3 through 6 illustrate the various conditions during the deep power down mode. Lines 7 and 8 illustrate the states of the signals during testing. Line 9 illustrates the states of the signals during the during the test mode. The states of the various signals during the various modes of operation are described in conjunction with FIGS. 7 through 10.

Figure 7:
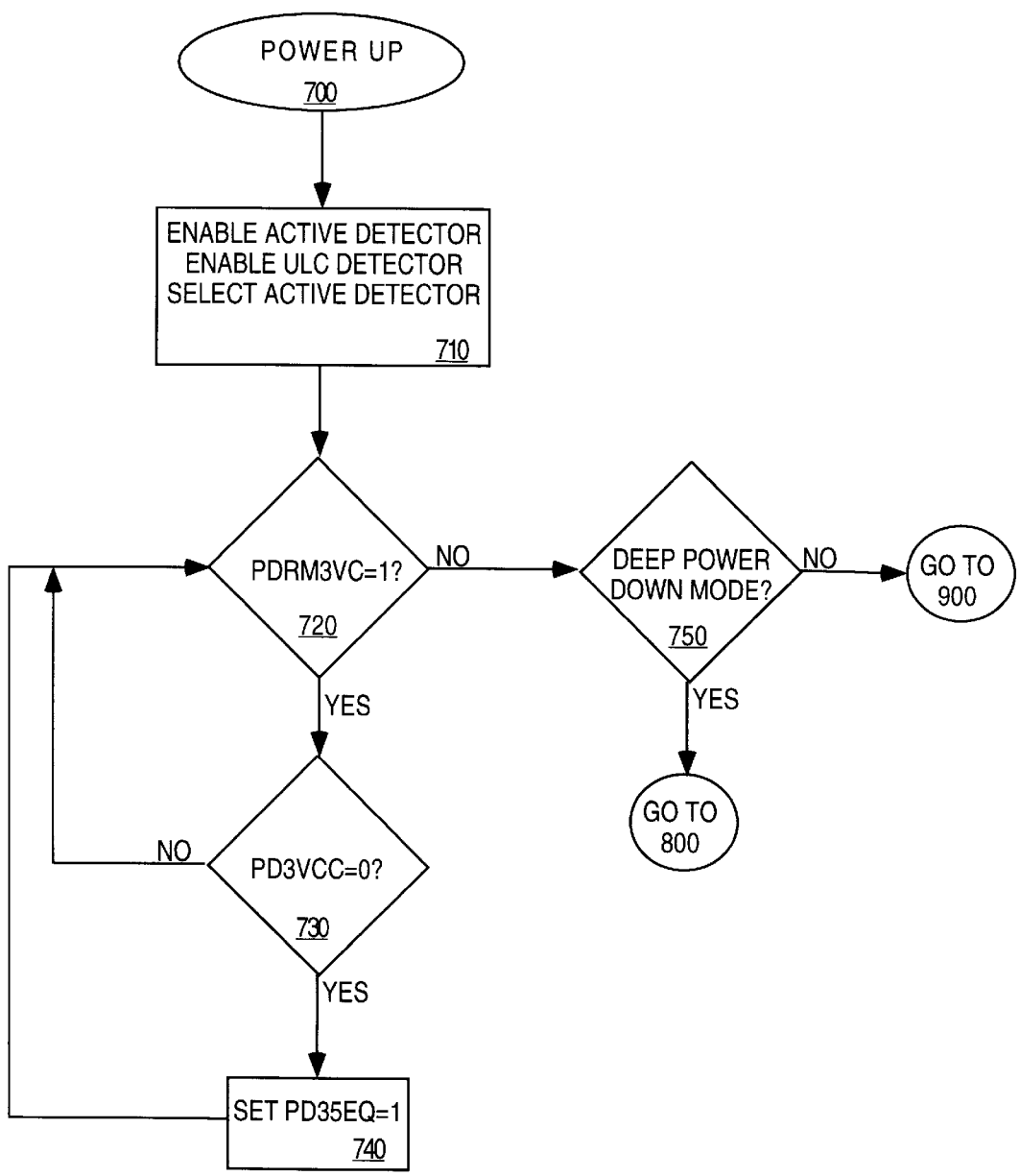
FIG. 7 illustrates a flow chart of the present VCC voltage level detector circuit operating during power-up in all user modes of operation.

FIGS. 7 through 10 illustrate the operation of the control circuit 510 during the various operating modes. FIG. 7 illustrates the various steps associated with the power-up mode. Step 700 indicates that the flash EEPROM device is being powered-up. Typically, during power-up, the power supply voltage or VCC is ramping up from approximately 0 volts to either 3.3 volts or 5.0 volts. Once the control circuit 510 detects the flash EEPROM device is in the power-up mode, the control circuit 510 enables the active detector 530, enables the ULC detector 520, and selects the PD3VCC signal from active detector 530 as shown in step 710. The output of the active detector 530 is selected by asserting the PD35MUX signal.

The control circuit 510 then determines whether the PDRM3VC signal, the delay signal from the ramp detector 410, is asserted (i.e., a logic "1") as shown in step 720. If the PDRM3VC signal is asserted, then the control circuit 510 determines whether the output signal PD3VCC of the active detector 530 is deasserted (i.e., a logic "0") as shown in step 730. If PD3VCC is asserted indicating that the active detector 530 has detected that VCC is at 3.3 volts, then the control circuit 510 returns to step 720. When the PD3VCC signal is deasserted, the active detector 530 has detected that VCC is at 5 volts. The control circuit 510 will then set the PD35EQ signal to a logic "1" as shown in step 740. Setting the PD35EQ signal to a logic "1" forces the ULC detector 520 into the tripped state. Typically, the ULC detector 520 is forced into the tripped state when the active detector 530 has detected VCC at 5.0 volts during power-up. Forcing the ULC detector 520 into the tripped state causes the ULC detector 520 to output a logic "0" indicating the part is detecting 5.0 volts. After the PD35EQ signal is set to a logic "1", then the control logic 510 checks to see of the PDRM3VC signal is still at a logic "1" in step 720.

Once the PDRM3VC signal is set to a logic "0" indicating that the flash EEPROM device is no longer in the power-up mode, the control circuit 510 determines whether the flash EEPROM device is selected to operate in the deep down power mode. The PDEN signal received by the control logic 510 indicates whether the EEPROM device is selected to operate in the deep power down mode of operation or the standby/active modes of operation. If the PDEN signal is deasserted with a logic "0" indicating that the power down mode has been selected, then the next step is to go to step 800. On the other hand, if the PDEN signal is asserted with a logic "1" indicating that the standby or active mode has been selected, then the next step is to go to step 900.

Figure 8:
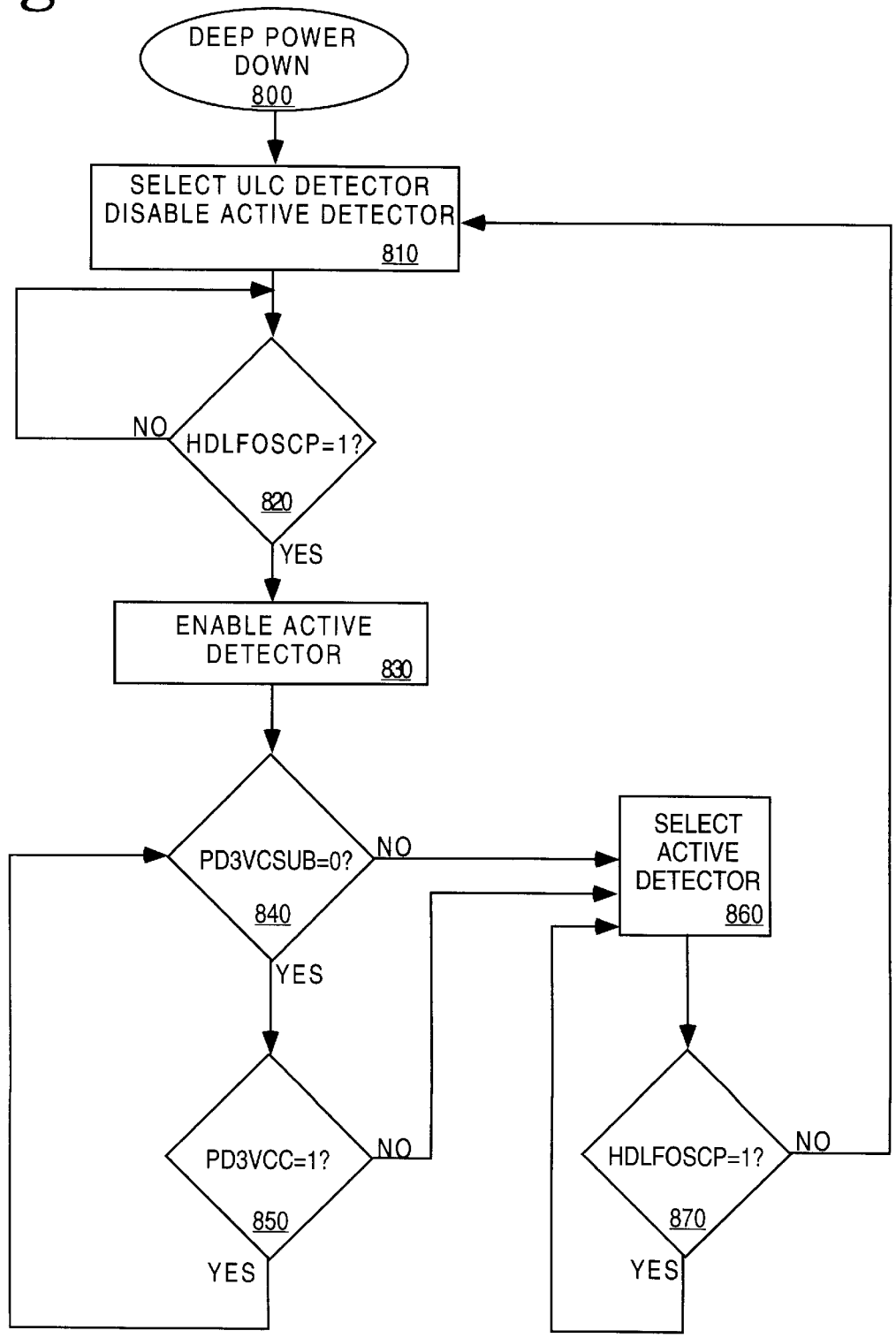
FIG. 8 illustrates a flow chart of the present VCC voltage level detector circuit operating in the deep power down mode of operation.

FIG. 8 illustrates a flowchart for the deep power down mode of operation starting at step 800. The deep power down mode of operation is selected when the PDEN signal is deasserted. When the control circuit 510 detects that the flash EEPROM device is operating in the deep power down mode, the control logic 510 selects the output signal PD3VCSUB from the ULC detector 520 as the input into the multiplexer 540 and disables the active detector 530, as shown in step 810. The output signal PD3VCSUB is selected by deasserting the PD35MUX signal.

The control logic 510 then checks if the HDLFOSCP signal is a logic "1" in step 820. The HDLFOSCP signal represents the signal from the low frequency pulse generator 450. The active detector 530 remains disabled as long as the HDLFOSCP signal is a logic "0". Once the HDLFOSCP signal is asserted with a logic "1", then the control logic 510 enables the active detector 530 as shown in step 830.

Once the active detector 530 is enabled but before the output signal PD3VCC of the active detector 530 is actually selected as the input for the multiplexer 540, the control logic 510 ensures that the active detector 530 is warmed-up. Therefore, in step 840, if the ULC detector 520 outputs an asserted PD3VCSUB signal (i.e., logic 1") indicating that a 3.3 volt VCC has been detected, the active detector 530 is selected by the multiplexer 540. In this situation, the active detector 530 does not need additional time to warm-up before being selected as the input to the multiplexer 540 in step 860.

On the other hand, if the ULC detector 520 outputs a deasserted PD3VCSUB signal (i.e., logic "0"), indicating that a 5.0 volts VCC has been detected, then the output signal PD3VCC of the active detector 530 is checked in step 850. If the PD3VCC signal is deasserted (i.e., a logic "0"), then the active detector 530 has detected that VCC is at 5.0 volts. Once the active detector 530 detects that VCC is at 5.0 volts, it is warmed-up and the multiplexer 540 selects the output signal PD3VCC as the input of the multiplexer 540 in step 860. If the PD3VCC signal is asserted (i.e., a logic "1"), then the PD3VCSUB signal is checked again in step 840.

Once the control circuit 510 selects the active detector 530 in step 860, the HDLFOSCP signal is checked in step 870. Once the HDLFOSCP signal is deasserted, then the control circuit 510 returns to step 810.

Figure 9:
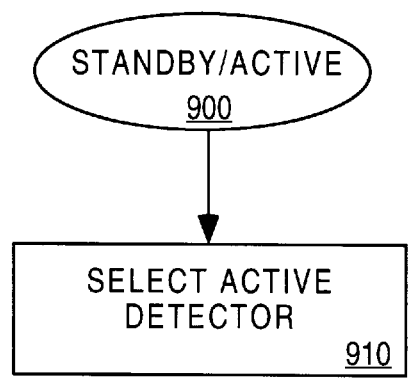
FIG. 9 illustrates a flow chart of the present VCC voltage level detector circuit operating in the standby or active modes of operation.

The control logic 510 continues to follow the steps shown in FIG. 8 until the control logic 510 determines that the deep power down mode of operation is no longer selected. Although not shown in FIG. 8, the flash EEPROM device may exit the deep power down mode during any of the steps shown in FIG. 8. When this occurs, the control circuit 510 immediately exits the current step in FIG. 8 and warms up the active detector 530 to operate in either the standby or active modes of operation. FIG. 9 illustrates that when the standby or active modes of operation is selected in step 900, the control logic 510 selects the output of the active detector 530 as the input for the multiplexer 540 in step 910. The flash EEPROM device may exit the standby or the active mode during any of the steps shown in FIG. 9. When this occurs, the control circuit immediately exits the current step and enters step 800.

Figure 10:
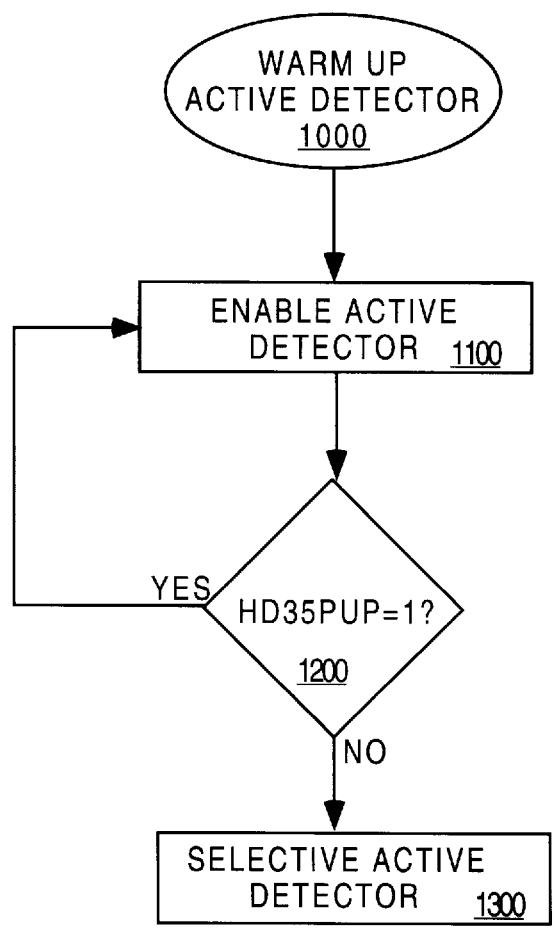
FIG. 10 illustrates a flow chart of the present VCC voltage level detector circuit operating while the active detector is warming up.

FIG. 10 illustrates the warm-up mode of the active detector 530. Step 1000 indicates that the active detector must be warmed up to operate in either the standby or active modes of operation. The control logic 510 enables the active detector 530 in step 1100. The active detector 530 is enabled when the PDEN35 signal is asserted. Once the active detector 530 is enabled, then the HD35PUP signal is checked in step 1200. The HD35PUP signal is asserted (i.e., logic "1") while the active detector 530 is transitioning from the deep power down mode to either the standby or active modes of operation. Once the HD35PUP signal is deasserted, indicating the active detector 530 is warmed-up, the output of the active detector 530 is selected as the input for the multiplexer 540 as shown in step 1300. The output of the active detector 530 is selected by asserting the PD35MUX signal.

Figure 11:
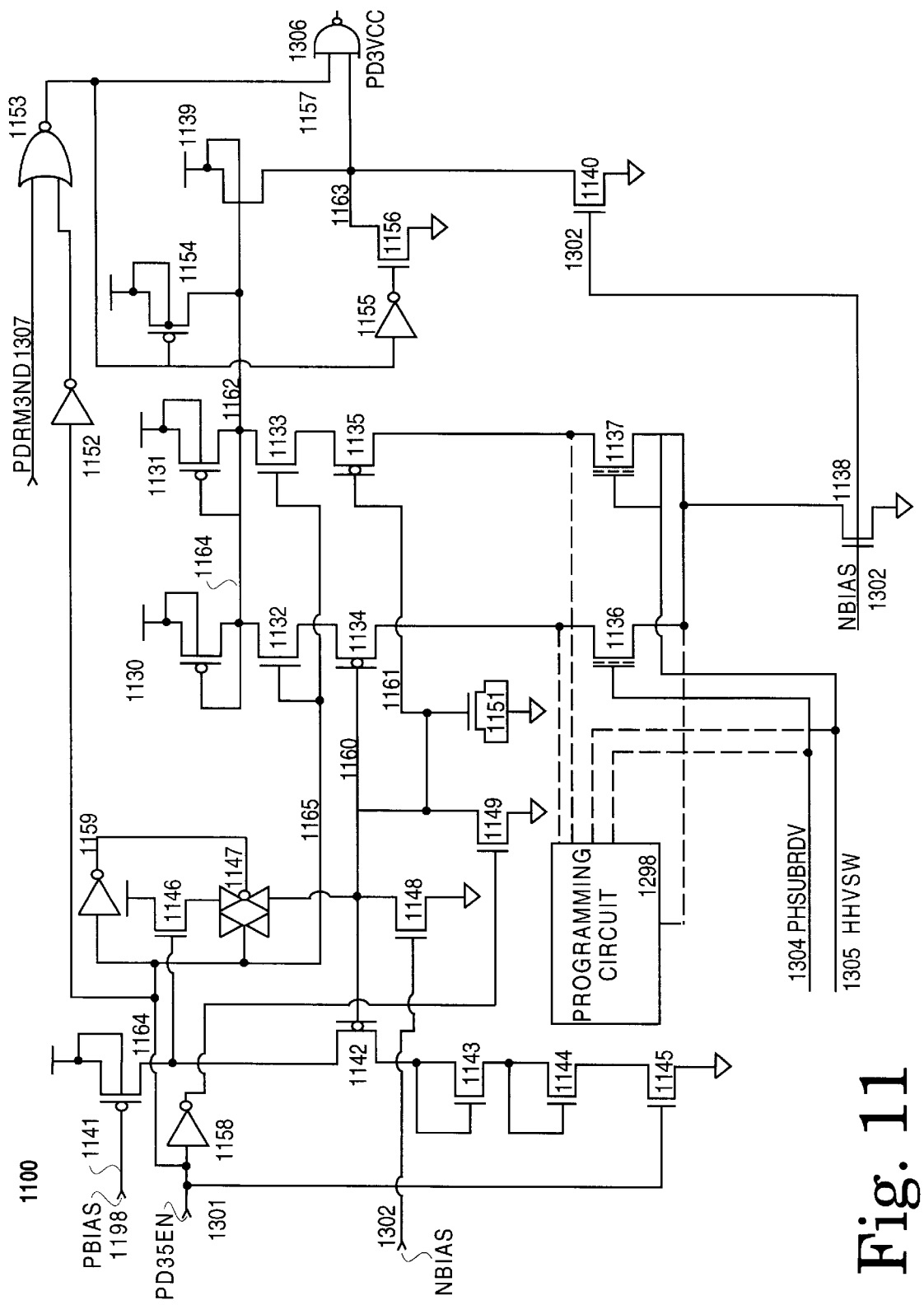
FIG. 11 illustrates one embodiment of the present active detector circuit.

FIG. 11 is a detailed drawing of one embodiment of the active detector 1100. The active detector 1100 detects the voltage level of the VCC power supply source, which is coupled to the input 1305. The HHVSW signal is from the power supply source and is also referred to as the VCC signal. The active detector 1100 includes a pair of flash EEPROM memory cells 1136 and 1137. The flash EEPROM memory cells 1136 and 1137 are floating gate field effect transistor ("FET") memory cells. According to FIG. 11, the flash EEPROM memory cells 1136 and 1137 are essentially identical and are arranged in similar circuits between VCC and ground. The drain terminal of the flash EEPROM memory cell 1136 is coupled to VCC via the transistors 1134, 1132, and 1130 and the source terminal of the flash EEPROM memory cell 1136 is coupled to ground via the transistor 1138. Similarly, the drain terminal of the flash EEPROM memory cell 1137 is coupled to VCC via the transistors 1131, 1133, and 1135 and the source terminal of the flash EEPROM memory cell 1137 is coupled to ground via the transistor 1138.

The trip point of the voltage detector is controlled by precisely programming each of the flash EEPROM memory cells 1136 and 1137 to the desired threshold voltage Vt. The trip point defines the voltage level of VCC in which the current flowing through the flash EEPROM memory cell 1136 equals the current flowing through the flash EEPROM memory cell 1137. For one embodiment, the flash EEPROM memory cells 1136 and 1137 are programmed in a well known manner to 2.7 volts and 4.0 volts, respectively, (through the programming circuit 1298) to yield the desired trip point of 4.0 volts.

The pair of flash EEPROM cells 1136 and 1137 together with the transistors 1130, 1131, 1132, 1133, 1134, 1135, and 1138 operate together as a differential amplifier. This differential amplifier measures the difference in voltage between inputs 1304, which is coupled to a voltage divider, and 1305, which is coupled to the VCC power supply source. The voltage divider will be discussed in detail in accordance with FIG. 13.

The transistor 1138 is an n-channel metal oxide semiconductor ("MOS") transistor which sets the bias current for the differential amplifier. The gate terminal 1302 of the transistor 1138 receives the NBIAS signal from the current source 460. For one embodiment, the transistor 1138 may include 32 transistors coupled in parallel to increase the bias current. Note that the transistor 1134 and the transistor 1135 operate as cascode devices. The cascode transistor 1134 has its drain terminal coupled to the source terminal of transistor 1132, its source terminal coupled to the drain of the flash EEPROM cell 1136, and its gate terminal coupled to the node 1160. Similarly, the cascode transistor 1135 has its drain terminal coupled to the source terminal of transistor 1133, its source terminal coupled to the drain terminal of the flash EEPROM cell 1137, and its gate terminal coupled to the node 1160.

The transistors 1130 and 1131 are p-channel MOS transistors connected in a mirror arrangement with their source terminals coupled to VCC and their gate terminals coupled together. Furthermore, the drain terminals of the transistors 1130 and 1131 are respectively coupled to the drain terminals of the transistors 1136 and 1137 through the transistors 1132, 1134, 1133, and 1135.

The portion of the differential amplifier previously described is referred to as the first stage of the differential amplifier. The differential amplifier also includes a gain stage or a second stage, comprising the p-channel MOS transistor 1139 and an n-channel MOS transistor 1140. The gate terminal of transistor 1139 is coupled to the first stage of the differential amplifier at node 1162. When the voltage at node 1162 is low, then the voltage at node 1163 is pulled high. On the other hand, when the voltage at node 1162 is high, the voltage at 1163 is pulled low. The transistor 1140 operates as the bias device for the current flowing through the second stage of the differential amplifier. For one embodiment, the transistor 1138 includes 16 transistors coupled in a parallel. The gate terminal 1302 of the transistor 1140 receives the NBIAS signal from the current source 460.

For one embodiment, the voltage at the input 1304 is two thirds the voltage at the input 1305. Because the flash EEPROM memory cells 1136 and 1137 are respectively programmed to have threshold voltages of 2.7 and 4.0 volts, the flash EEPROM memory cell 1137 will draw more current than the flash EEPROM memory cell 1136 when the voltage of the VCC power supply source is greater than 4 volts. Furthermore, the flash EEPROM memory cell 1136 will draw more current then the flash EEPROM memory cell 1137 when the input voltage is less than 4.0 volts. The current flowing through the flash EEPROM memory cell 1136 is also flowing through the transistor 1130 and the transistor 1131. In order to maintain this current relationship, the voltage at the node 1162 is reduced when a higher current is flowing through the flash EEPROM memory cell 1137 than through the flash EEPROM memory cell 1136. On the other hand, if the current flowing through the flash EEPROM memory cell 1137 is lower than the current flowing through the flash EEPROM memory cell 1136, then the voltage at the node 1162 increases.

In the first scenario, when the voltage at the VCC power supply is less than 4.0 volts, the differential amplifier outputs a low logic level causing the active detector 1100 to output a high logic level at the node 1163. This indicates that the VCC power supply source is providing a 3.3 volt VCC. In the second scenario, when the voltage at the VCC power supply is greater than 4.0 volts, the differential amplifier outputs a high logic level causing the active detector 1100 to output a logic low level at the node 1163. This indicates that the VCC power supply source is providing a 5.0 volt VCC. The NAND gate 1157 operates as an inverter and provides the output signal PD3VCC. The output signal PD3VCC is a logic "1" when the active detector 1100 detects a VCC voltage level of 3.3 volts and logic a "0" when the active detector 1100 detects a VCC voltage level of 5.0 volts.

As mentioned previously, the node 1160 is coupled to the cascode voltage generator. The cascode voltage generator includes the transistors 1141, 1142, 1143, 1144, and 1145 coupled between VCC and VSS. The cascode voltage generator also includes the transistor 1146, the transmission gate 1147, and the transistor 1148 coupled between VCC and VSS. Furthermore, the cascode voltage generator includes the inverters 1158 and 1159 which are used to invert the PD35EN signal at the input 1301. The transistors 1149 and 1151 are also included in the cascode voltage generator.

The transistor 1141 is a p-channel MOS transistor that biases the cascode voltage generator with very low current. The gate terminal of the transistor 1141 receives the PBIAS signal from the current source 460 at the input 1198. The transistors 1143 and 1144 are n-channel MOS transistors operating as two diodes coupled in series. The transistor 1145 is an n-channel MOS transistor having its gate terminal coupled to the input 1301 for receiving the signal PD35EN. Therefore, the transistor 1145 is turned on when the active detector 1100 is enabled. When the transistor 1145 is turned on, the source of the transistor 1144 is coupled to ground. Therefore, the voltage at the drain of the transistor 1144 is at a voltage of $1V_{TN}$ above ground and the drain of transistor 1143 is at a voltage of $2V_{TN}$ above ground. The p-channel MOS transistor 1142 is a low threshold device that requires a gate voltage of $V_{TS}$ plus $2V_{TN}$ in order to be turned on. $V_{TN}$ refers to the threshold voltage of a normal n-channel transistor and $V_{TS}$ refers to the threshold voltage of a low threshold n-channel transistor. Note that the gate terminal of the transistor 1142 is coupled to the node 1160.

In order for the node 1160 to be held at $2V_{TN}$ plus $V_{TS}$, the transmission gate 1147 must be shorted and the gate voltage of the transistor 1146 must be at $3V_{TN}$ plus $V_{TS}$. Therefore, the transistors 1142 and 1146 are coupled in a feed back loop where the drain of the transistor 1142 is coupled to the gate of the transistor 1146, and the source of transistor 1146 is coupled to the gate of transistor 1142. This feed back loop clamps the voltage at node 1160 once VCC is at $3V_{TN}$ plus $V_{TS}$ and creates a reference voltage to control the gate of the cascode devices 1134 and 1135.

The cascode voltage generator also includes the n-channel MOS transistors 1149 and 1151. The transistor 1151 operates as a capacitor. The transistor 1149 is used to quickly pull down the cascode voltage at node 1160 when the active detector 1100 is turned off. On the other hand, the transistor 1151 is used to prevent node 1160 from over-shooting when coming out of the deep power down mode.

The active detector 1100 also includes an initialization circuit comprising the NOR gate 1153, the transistor 1154, the transistor 1156, and the inverter 1155. This circuit is generally responsible for initializing the active detector 1100 by enabling or disabling the NAND gate 1157. The inverter 1152 receives the PD35EN signal from the input 1301. The NOR gate 1153 is coupled to the output of the inverter 1152. The NOR gate 1153 receives an inverted PD35EN signal and the signal PDRM3ND signal from the input 1307. Therefore, when the active detector 1100 is warmed up, the NAND gate 1157, operating as an inverter, is enabled.

The initialization circuit also ensures that the nodes 1162 and 1163 are initialized properly. When the active detector 1100 powers-up from ground, the node 1162 is not initialized without the initialization circuit. Typically, the transistor 1130 pulls up the voltage at node 1164 causing the transistor 1131 to shut off and the node 1162 to float. Therefore, the p-channel MOS transistor 1154 is used to initialize the node 1162. Furthermore, the n-channel MOS transistor 1156 and the inverter 1155 are used to initialize the node 1163. Typically, as the active detector 1100 is powering up, the current source 460 is also powering up as well, which provides the NBIAS signal at the input 1302. For proper initialization to occur, the node 1163 is forced to VSS.

The ULC detector 1200 operates in a similar manner as the active detector 1100, despite the fact that it consumes much less power. The ULC detector 1200 also includes a differential amplifier, a cascode voltage generator, a programming circuit 1299, and an initialization circuit.

The differential amplifier includes two stages. For one embodiment, the first stage includes a pair of flash EEPROM cells 1184 and 1185, a pair of cascode transistors 1182 and 1183, a pair of p-channel MOS transistors 1179 and 1181, and an n-channel MOS transistor 1186 which biases the first stage in the subthreshold region. The first stage of the differential amplifier in the ULC detector 1200 operates in a similar manner as the first stage of the differential amplifier in the active detector 1100.

One difference between the active detector 1100 and the ULC detector 1200 is the size of the bias transistors. As a result, the ULC detector 1200 consumes much less power than the active detector 1100. For one embodiment, the bias transistors 1138 and 1140 in the active detector 1100 have a 2:1 ratio in which the bias transistor 1138 actually includes 32 transistors and the transistor 1140 includes 16 transistors. Furthermore, for one embodiment, the bias transistors 1186 and 1178 in the ULC detector 1200 have a 2:1 ratio in which the bias transistor 1186 actually includes two transistors and the bias transistor 1178 includes one transistor. For one embodiment, both detectors are biased in the subthreshold region. The subthreshold region of a MOS FET transistor allows conduction of finite, but small currents, for $V_{GS}$ less than the extrapolated threshold voltage ($V_T$). Biasing the detectors in this region allows significant power savings.

Another difference between the active detector 1100 and the ULC detector 1200 is that the ULC detector 1200 includes additional circuitry to force the ULC detector 1200 into the tripped state. This circuit is also referred to as the equalization circuit. The additional circuitry includes the inverter 1199, the transistor 1103, and the transistor 1176. The ULC detector 1200 may take a much longer time to detect 5.0 volts than the active detector 1100 during power-up. Therefore, when the 3.0V/5.0V detector 500 is powering up and the active detector 1100 detects that VCC is at 5.0 volts, the ULC detector 1200 is forced to detect 5.0 volts. Therefore, the detectors are in sync and detect the same VCC voltage levels after a relatively short period of time.

The inverter 1199 receives the PD35EQ signal from the input 1308 which causes the ULC detector 1200 to be tripped when asserted. The output of the inverter 1199 is coupled to the gate terminal of the p-channel MOS transistor 1176. The PD35EQ signal is also provided to the n-channel MOS transistor 1103. Note that node 1122 is a node that limits the speed in which the ULC detector 1200 detects a transition in the VCC voltage level. Therefore, by asserting the PD35EQ signal and pulling the node 1122 down, the transistor 1187 is turned on and the node 1124 goes high. Eventually, after being inverted by the NAND gate 1106, the inverter 1107, and the inverter 1108, the PD3ENSUB signal is deasserted to indicate that VCC is at 5.0 volts.

The operation of the cascode voltage generator that controls the gate voltage of the transistors 1182 and 1183 in the differential amplifier operates in the same manner as the cascode voltage generator in the active detector 1100. Therefore, the cascode voltage generator in the ULC detector will not be described in further detail. Also, the initialization circuit in the ULC detector operates in the same manner as the initialization circuit in the active detector 1100 and therefore, will not be described in further detail here. Furthermore, the programming circuitry 1300 operates in the same manner as the programming circuitry 1200 in the active detector 1100. Therefore, the programming circuit 1300 will not be described in further detail here. Note that the ULC detector 1200 is enabled by the PDSUBEN signal received at the input 1309 and the ULC detector 1200 provides the output signal PD3VCSUB at the output 1330.

Figure 13:
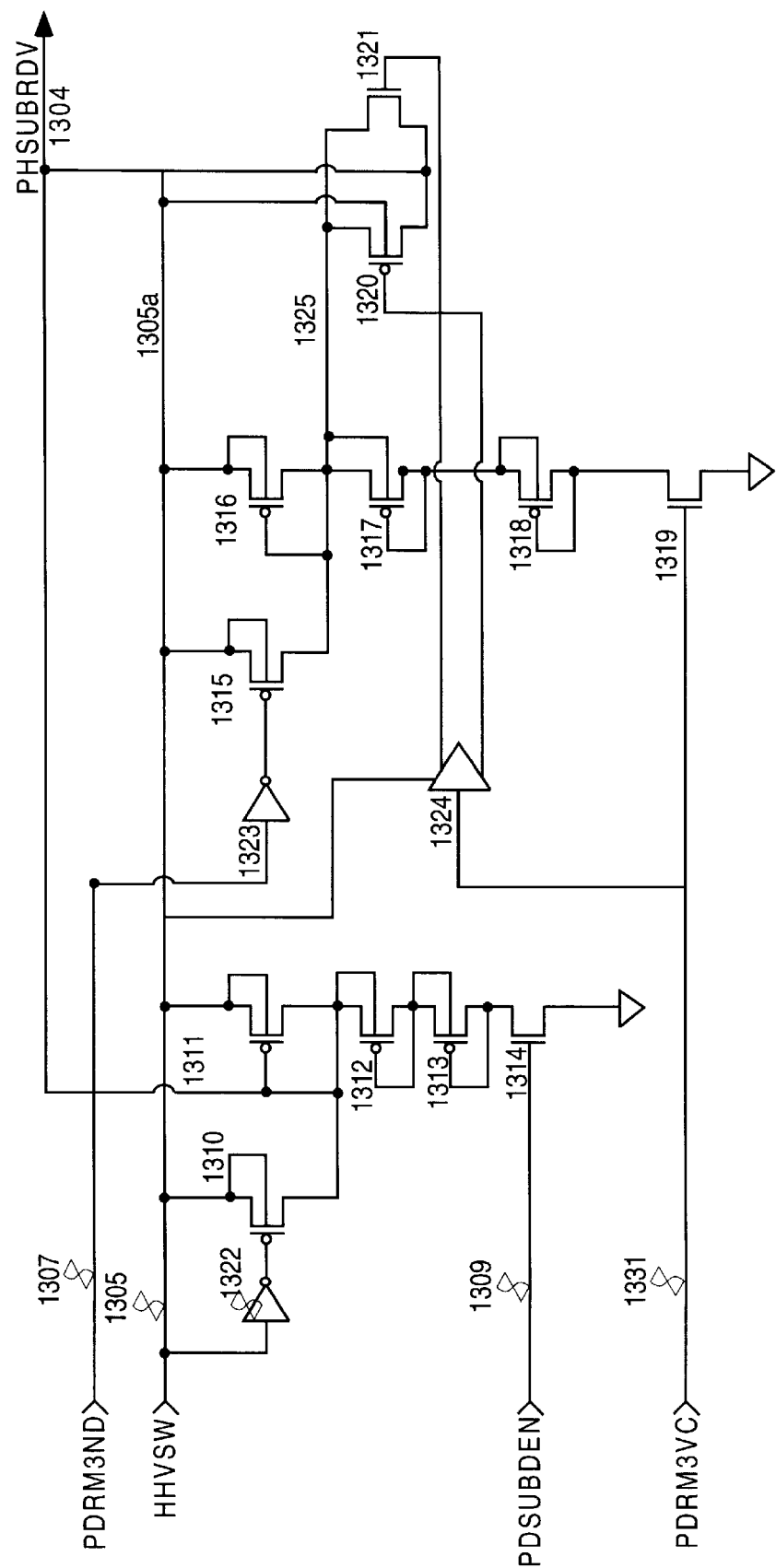
FIG. 13 illustrates one embodiment of the present voltage divider circuit.

FIG. 13 illustrates one embodiment of a voltage divider 1300. The voltage divider 1300 includes two independent voltage divider circuits referred to as the high current resistor divider ("HCRD") circuit and the low current resistor divider ("LCRD") circuit. The HCRD circuit and the LCRD circuit are coupled via a transmission gate.

Figure 12:
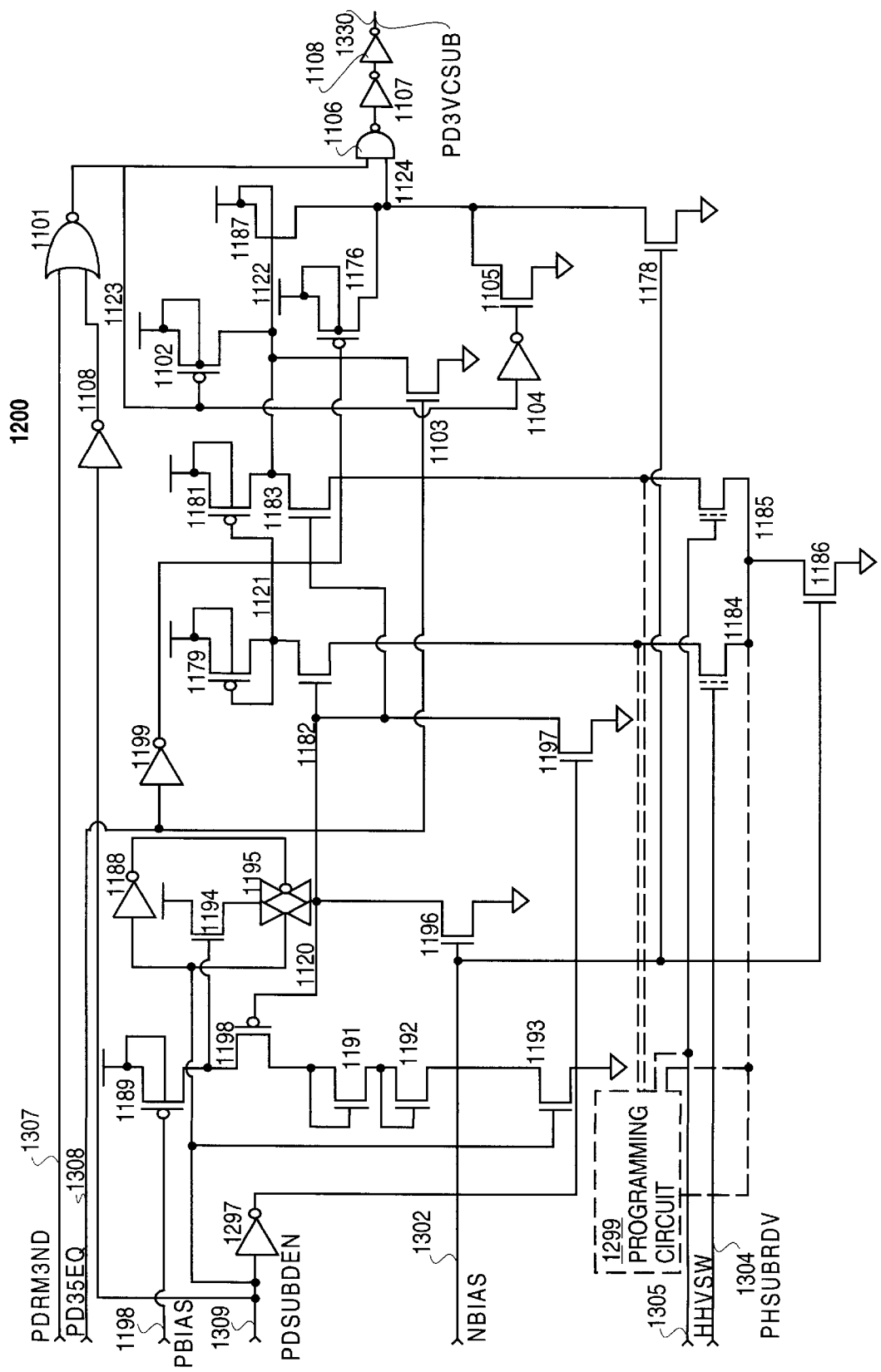
FIG. 12 illustrates one embodiment of the present active detector circuit.

The HRCD circuit is enabled during power-up when the PDRM3VC signal is asserted. The LCRD circuit is enabled during all user modes of operation. Therefore, when the HCRD circuit is on during power-up, the transmission gate is closed and both the HRCD circuit and the LCRD circuit are coupled to the flash EEPROM memory cells 1184 and 1136 in the active detector 1100 and the ULC detector 1200. Note that the voltage divider 1300 is coupled to the active detector 1100 and the ULC detector 1200 via the output 1304 in FIG. 13 which corresponds to the input 1304 in FIGS. 11 and 12. In other words, during power-up the HCRD circuit helps the LCRD circuit power-up the detectors 1100 and 1200. Once the PDRM3VC signal from the input 1331 is deasserted indicating that the detectors 1100 and 1200 are no longer in the power-up mode, the transmission gate is opened and only the LCRD circuit remains coupled to the flash EEPROM memory cells 1184 and 1136 in the active detector 1100 and the ULC detector 1200.

The HCRD circuit includes the p-channel MOS transistors 1316, 1317, and 1318 and the n-channel MOS transistor 1319. The transistors 1316, 1317, 1318, and 1319 provide a current path between the power supply source and ground. The inverter 1323 and the p-channel transistor 1315 help to initialize the HCRD circuit. Note that the voltage divider 1300 receives the HHVSW signal from the VCC power supply source. The gate of the transistor 1319 receives the PDRM3VC signal at the input 1331.

Therefore, when the PDRM3VC signal is asserted and the detectors 1100 and 1200 are in the power-up mode, the transistor 1318 is coupled to ground. Because each of the transistors 1316, 1317, and 1318 are approximately the same size and operates as a resistor, the voltage at node 1325a is approximately two-thirds the voltage at the node 1305a. When the transmission gate is closed, the voltage at node 1325 is coupled to the output 1304. This voltage is outputted from the voltage divider 1300 as the signal PHSUBRDV. On the other hand, when the PDRM3VC signal is deasserted, the transistor 1318 is not coupled to ground and the transistors 1316, 1317, and 1318 do not operate as a voltage divider.

The LCRD circuit includes the p-channel MOS transistors 1311, 1312, and 1313 serially coupled. The LCRD circuit also includes the n-channel MOS transistor 1314 which controls whether the transistors 1311, 1312, and 1313 provide a current path from the power supply voltage VCC to ground. The inverter 1322 and the p-channel transistor 1310 help to initialize the LCRD circuit. The gate of the transistor 1314 is coupled to the PDSUBDEN signal at the input 1309. Therefore, when the ULC detector 1200 is enabled (i.e., during all the user modes), the transistors 1311, 1312, and 1313 operate as a voltage divider. Because the transistors 1311, 1312, and 1313 are approximately the same size, they provide approximately the same resistance when operating. Therefore, during all user modes, the voltage at the node 1304 is approximately two-thirds the voltage at the node 1305a.

The transmission gate includes the p-channel MOS transistor 1320 and the n-channel MOS transistor 1321. The transmission gate is opened and closed in response to the PDRM3VC signal from the input 1331 and the HHVSW signal. As mentioned above, the transmission gate is closed during the power-up mode when PDRM3VC is asserted and open during all other modes.

What is claimed is:

1. An apparatus for detecting a power supply voltage level in a memory device, said memory device capable of operating in a plurality of power consumption modes, said apparatus comprising:

(a) a control circuit providing a first enable signal, a second enable signal, and a control signal, said control circuit operable to detect a power consumption mode of said plurality of power consumption modes;

(b) a first voltage level detector circuit coupled to the control circuit, the first voltage level detector circuit provides a first output signal in response to an asserted first enable signal;

(c) a second voltage level detector circuit coupled to the control circuit, the first voltage level detector circuit provides a second output signal in response to an asserted second enable signal; and (d) a select circuit coupled to the control circuit, the select circuit selects one of the first output signal and the second output signal in response to the control signal; and wherein the control signal selects the first output signal during a reduced power mode of operation, the control signal selects the second output signal during an active mode of operation and during power-up in all user modes of operation.

2. An apparatus for detecting a power supply voltage level, comprising:

(a) a control circuit providing a first enable signal, a second enable signal, and a control signal;

(b) a first voltage level detector circuit coupled to the control circuit, the first voltage level detector circuit provides a first output signal in response to an asserted first enable signal;

(c) a second voltage level detector circuit coupled to the control circuit, the first voltage level detector circuit provides a second output signal in response to an asserted second enable signal;

(d) a select circuit coupled to the control circuit, the select circuit selects one of the first output signal and the second output signal in response to the control signal; and (e) a voltage divider circuit including a high current divider circuit coupled to a low current divider circuit via a transmission gate, the low current divider circuit is coupled to the first voltage level detector circuit and the second voltage level detector circuit, the high current divider circuit is selectively coupled to the first voltage level detector circuit and the second voltage level detector circuit.

3. The apparatus of claim 2, wherein the high current divider circuit is coupled to the first voltage level detector circuit and the second voltage level detector circuit when the transmission gate is closed and decoupled from the first voltage level detector circuit and the second voltage level detector circuit when the transmission gate is open.

4. The apparatus of claim 3, wherein the transmission gate is closed during power-up in all user modes of operation and opened once powered-up in any of the user modes of operation.

5. An apparatus for detecting a power supply voltage level, comprising:

(a) a control circuit providing a first enable signal, a second enable signal, and a control signal;

(b) a first voltage level detector circuit coupled to the control circuit, the first voltage level detector circuit provides a first output signal in response to an asserted first enable signal, said first voltage level detector comprising:

(1) a differential amplifier circuit including a pair of flash memory cells;

(2) a programming circuit coupled to the differential amplifier circuit, the programming circuit is configured to program the pair of flash memory cells to achieve the desired trip point; and (3) an equalization circuit coupled to the differential amplifier circuit, the equalization circuit is configured to force the apparatus into a tripped state during power-up in any of the user modes of operation (c) a second voltage level detector circuit coupled to the control circuit, the first voltage level detector circuit provides a second output signal in response to an asserted second enable signal; and (d) a select circuit coupled to the control circuit, the select circuit selects one of the first output signal and the second output signal in response to the control signal.

6. The apparatus of claim 5, wherein the differential amplifier circuit further includes a pair of parallel current paths between a first voltage conduit and a second voltage conduit, each of the current paths includes one of the flash memory cells coupled to the first voltage conduit via one of a pair of cascode devices and one of a pair of transistors, each of the current paths is further coupled to the second voltage conduit via a bias device.

7. An apparatus for detecting a power supply voltage level, comprising:
   (a) a control circuit providing a first enable signal, a second enable signal, and a control signal;
   (b) a first voltage level detector circuit coupled to the control circuit, the first voltage level detector circuit provides a first output signal in response to an asserted first enable signal;
   (c) a second voltage level detector circuit coupled to the control circuit, the first voltage level detector circuit provides a second output signal in response to an asserted second enable signal, the second voltage level detector further comprising:
      (1) a differential amplifier circuit including a pair of flash memory cells; and
      (2) a programming circuit coupled to the differential amplifier circuit, the programming circuit is configured to program the pair of flash memory cells to achieve a desired trip point; and
   (d) a select circuit coupled to the control circuit, the select circuit selects one of the first output signal and the second output signal in response to the control signal.

8. The apparatus of claim 7, wherein the differential amplifier circuit further includes a pair of parallel current paths between a first voltage conduit and a second voltage conduit, each of the current paths includes one of the flash memory cells coupled to the first voltage conduit via one of a pair of cascode devices and one of a pair of transistors, each of the current paths is further coupled to the second voltage conduit via a bias device.

9. An apparatus for detecting a power supply voltage level, comprising:
   (a) a control circuit providing a first enable signal, a second enable signal, and a control signal;
   (b) a first voltage level detector circuit coupled to the control circuit, the first voltage level detector circuit provides a first output signal in response to an asserted first enable signal;
   (c) a second voltage level detector circuit coupled to the control circuit, the first voltage level detector circuit provides a second output signal in response to an asserted second enable signal; and
   (d) a select circuit coupled to the control circuit, the select circuit selects one of the first output signal and the second output signal in response to the control signal;
and wherein the first voltage level detector circuit consumes less power than the second voltage level detector circuit.

10. An apparatus for detecting a power supply voltage level, comprising:
   (a) a differential amplifier circuit including a pair of flash memory cells;
   (b) a programming circuit coupled to the differential amplifier circuit, the programming circuit is configured to program the pair of flash memory cells to achieve a desired trip point; and
   (c) an equalization circuit coupled to the differential amplifier circuit the equalization circuit is configured to force the apparatus into a tripped state during power-up in any of the user modes of operation;
and wherein the differential amplifier circuit further includes a pair of parallel current paths between a first voltage conduit and a second voltage conduit, each of the current paths includes one of the flash memory cells coupled to the first voltage conduit via one of a pair of cascode devices and one of a pair of transistors, each of the current paths is further coupled to the second voltage conduit via a bias device.

11. A computer system comprising:
   (a) a processor;
   (b) a bus;
   (c) a main memory; and
   (d) a flash EEPROM memory array arranged to provide non-volatile long term storage, said flash EEPROM memory array having a power supply voltage level detector circuit that includes
      (1) a control circuit providing a first enable signal, a second enable signal, and a control signal,
      (2) a first voltage level detector circuit coupled to the control circuit, the first voltage level detector circuit provides a first output signal in response to an asserted first enable signal,
      (3) a second voltage level detector circuit coupled to the control circuit, the first voltage level detector circuit provides a second output signal in response to an asserted second enable signal, and
      (4) a select circuit coupled to the control circuit, the select circuit selects one of the first output signal and the second output signal in response to the control signal.

12. A method for detecting the power supply voltage level of a circuit, comprising the steps of:
   (a) providing a power supply voltage;
   (b) enabling a first voltage level detector circuit and a second voltage level detector circuit;
   (c) selecting the second voltage level detector circuit;
   (d) providing an asserted power ramp-up signal while the power supply voltage ramps from a first voltage level to one of a second voltage level and a third voltage level;
   (e) detecting the third voltage level by the second voltage level detector circuit;
   (f) setting the first voltage level detector circuit to the third voltage level;
   (g) providing a deasserted power ramp-up signal once the power supply voltage is ramped-up to one of the second voltage level and the third voltage level
   (h) determining the selected mode of operation of the circuit;
   (i) disabling the second voltage level detector if a reduced power mode is selected;
   (j) deselecting the second voltage level detector circuit and selecting the first voltage level detector circuit if the reduced power mode is selected; and
   (k) outputting a voltage level detection signal by the selected one of the first voltage detector and the second voltage detector.

13. The method of claim 12, further comprising the steps of:
   (l) selecting another user mode of operation of the circuit;
   (m) enabling the second voltage level detector circuit; and
   (n) selecting the second voltage level detector circuit.

14. The method of claim 13, further comprising the step of warming-up the second voltage level detector circuit.

15. The method of claim 12, wherein step (j) further comprises the steps of:
(1) receiving a control signal;
(2) enabling the second voltage level detector circuit in response to an asserted control signal;
(3) selecting the second voltage level detector circuit; and
(4) disabling the second voltage level detector circuit in response to a deasserted control signal.

16. The method of claim 15, further comprising the step prior to step (3) of warming up the second voltage level detector circuit.

17. A method for detecting the power supply voltage level of a circuit, comprising the steps of:
(a) providing a power supply voltage having a first voltage level or a second voltage level;
(b) detecting a power consumption mode of operation of said circuit;
(c) enabling a first voltage level detector circuit;
(d) enabling a second voltage level detector circuit if not previously enabled and if the circuit is operating in an active power consumption mode;
(e) disabling the second voltage level detector circuit if the circuit is operating in a reduced power consumption mode;
(f) outputting a first signal indicating the power supply voltage level detected by the first voltage level detector circuit if the circuit is operating in the reduced power consumption mode; and
(g) outputting a second signal indicating the power supply voltage level detected by the second voltage level detector circuit if the circuit is operating in the active power consumption mode.

18. A method for detecting the power supply voltage level of a circuit comprising the steps of:
(a) providing a power supply voltage having a first voltage level or a second voltage level;
(b) enabling a first voltage level detector circuit;
(c) enabling a second voltage level detector circuit if not previously enabled and if the circuit is operating in an active mode;
(d) disabling the second voltage level detector circuit if the circuit is operating in a reduced power mode;
(e) outputting a first signal indicating the power supply voltage level detected by the first voltage level detector circuit if the circuit is operating in the reduced power mode; and (f) outputting a second signal indicating the power supply voltage level detected by the second voltage level detector circuit if the circuit is operating in the active mode;
(g) ramping the power supply voltage from a third voltage level to one of the first voltage level and the second voltage level;
(h) enabling the second voltage level detector during step (g); and
(i) outputting the second signal during step (g).

19. The method of claim 18, further comprising after step (h) and prior to step (i), the steps of:
(j) detecting the second voltage level by the second voltage level detector circuit; and
(k) forcing the first voltage detector to detect the second voltage level.

20. The method of claim 18, wherein step (c) further includes the step of enabling the second voltage level detector circuit if the circuit is operating in a second reduced power mode.

21. The method of claim 18, further comprising prior to step (e) and during the reduced power mode, the steps of:
(1) selecting the first voltage level detector circuit;
(2) enabling the second voltage detector in response to an asserted control signal;
(3) selecting the second voltage detector circuit; and
(4) disabling the second voltage level detector circuit in response to a deasserted control signal.

22. The method of claim 21, further comprising prior to step (3) the steps of:
(5) determining the second voltage level detector circuit is warmed-up.

23. The method of claim 22, wherein step (5) further comprises the step of detecting the first voltage level by the first voltage level detector circuit.

24. The method of claim 22, wherein step (5) further comprises the steps of:
(i) detecting the second voltage level by the first voltage level detector circuit; and
(ii) detecting the second voltage level by the second voltage level detector circuit.

25. The method of claim 18, wherein step (b) further comprises the step of selecting the first voltage level detector circuit if the circuit is operating in the reduced power mode.

* * * * *